US012764872B2

(12) United States Patent
Ikeda et al.

(10) Patent No.: US 12,764,872 B2
(45) Date of Patent: Oct. 13, 2026

(54) METHOD FOR MANUFACTURING WIRING SUBSTRATE

(71) Applicant: IBIDEN CO., LTD., Ogaki (JP)

(72) Inventors: Tomoyuki Ikeda, Ogaki (JP); Keisuke Shimizu, Ogaki (JP); Hiroyuki Watanabe, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 745 days.

(21) Appl. No.: 17/822,883

(22) Filed: Aug. 29, 2022

(65) Prior Publication Data

US 2023/0069980 A1 Mar. 9, 2023

(30) Foreign Application Priority Data

Sep. 8, 2021 (JP) ................................ 2021-146038

(51) Int. Cl.
*H05K 3/38* (2006.01)
*H05K 3/00* (2006.01)

(52) U.S. Cl.
CPC ........... *H05K 3/381* (2013.01); *H05K 3/0055* (2013.01); *H05K 3/389* (2013.01); *H05K 3/0035* (2013.01); *H05K 2203/107* (2013.01); *H05K 2203/11* (2013.01); *H05K 2203/143* (2013.01)

(58) Field of Classification Search
CPC ...... H05K 3/381; H05K 3/0055; H05K 3/389; H05K 3/0035; H05K 2203/107; H05K 2203/11; H05K 2203/143
See application file for complete search history.

(56) References Cited

U.S. PATENT DOCUMENTS 5,487,999 A * 1/1996 Farnworth ........... G01R 1/0466 257/E23.07
6,286,207 B1 * 9/2001 Oura ....................... C23C 18/22 29/830
7,504,719 B2 * 3/2009 En ............................ C23G 1/10 438/622
7,674,987 B2 * 3/2010 Kodama .............. H05K 1/0274 174/260

(Continued)

FOREIGN PATENT DOCUMENTS

JP 2001-085837 A 3/2001
JP 2010010639 A * 1/2010 ......... H01L 21/4846

OTHER PUBLICATIONS

Translation of JP 2010-010639 A (Year: 2018).*

*Primary Examiner* — Jeffrey T Carley
(74) *Attorney, Agent, or Firm* — Finnegan, Henderson, Farabow, Garrett & Dunner, LLP

(57) ABSTRACT

A method for manufacturing a wiring substrate includes forming a resin insulating layer on a first conductor layer such that the resin insulating layer covers the first conductor layer, applying a roughening treatment on a surface of the resin insulating layer on the opposite side with respect to the first conductor layer, forming an opening in the resin insulating layer after the roughening treatment on the surface of the resin insulating layer such that the opening penetrates through the resin insulating layer and exposes a portion of the first conductor layer, and forming a second conductor layer on the surface of the resin insulating layer such that the second conductor layer is formed in contact with the surface of the resin insulating layer and that a via conductor is formed in the opening of the resin insulating layer.

20 Claims, 6 Drawing Sheets

(56) References Cited

U.S. PATENT DOCUMENTS

| | | | | |
|---|---|---|---|---|
| 7,995,880 | B2 * | 8/2011 | Kodama | G02B 6/4214<br>385/88 |
| 8,076,264 | B2 * | 12/2011 | Tsurumi | C23C 18/208<br>502/402 |
| 10,827,622 | B2 * | 11/2020 | Nakamura | H05K 3/007 |
| 2001/0019177 | A1 * | 9/2001 | Sugihara | G01R 3/00<br>257/780 |
| 2005/0102831 | A1 * | 5/2005 | Saiki | H05K 3/4661<br>29/846 |
| 2005/0103520 | A1 * | 5/2005 | Saiki | H05K 3/0035<br>174/250 |
| 2005/0244621 | A1 * | 11/2005 | Arai | H05K 3/0038<br>428/209 |
| 2006/0009026 | A1 * | 1/2006 | Sawaguchi | H05K 3/465<br>438/622 |
| 2007/0051459 | A1 * | 3/2007 | Yamano | H05K 3/4661<br>216/13 |
| 2008/0314632 | A1 * | 12/2008 | Wu | H05K 1/115<br>174/263 |
| 2009/0133910 | A1 * | 5/2009 | Ohashi | H05K 3/0032<br>205/160 |
| 2009/0178840 | A1 * | 7/2009 | Kim | H05K 3/4661<br>216/13 |
| 2012/0153463 | A1 * | 6/2012 | Maeda | H01L 23/49822<br>174/262 |
| 2013/0133926 | A1 * | 5/2013 | Kim | C25D 5/026<br>174/250 |
| 2014/0083745 | A1 * | 3/2014 | Shimizu | H05K 3/4652<br>174/251 |
| 2014/0118964 | A1 * | 5/2014 | Nakamura | H05K 3/465<br>361/748 |
| 2015/0034369 | A1 * | 2/2015 | Kashima | H05K 3/4676<br>428/209 |
| 2022/0225503 | A1 * | 7/2022 | Tanaka | H05K 3/4007 |

* cited by examiner

METHOD FOR MANUFACTURING WIRING SUBSTRATE

CROSS-REFERENCE TO RELATED APPLICATIONS

The present application is based upon and claims the benefit of priority to Japanese Patent Application No. 2021-146038, filed Sep. 8, 2021, the entire contents of which are incorporated herein by reference.

BACKGROUND OF THE INVENTION

Field of the Invention

The present invention relates to a method for manufacturing a wiring substrate.

Description of Background Art

Japanese Patent Application Laid-Open Publication No. 2001-85837 describes a method for manufacturing a multilayer printed wiring board. The entire contents of this publication are incorporated herein by reference.

SUMMARY OF THE INVENTION

According to one aspect of the present invention, a method for manufacturing a wiring substrate includes forming a resin insulating layer on a first conductor layer such that the resin insulating layer covers the first conductor layer, applying a roughening treatment on a surface of the resin insulating layer on the opposite side with respect to the first conductor layer, forming an opening in the resin insulating layer after the roughening treatment on the surface of the resin insulating layer such that the opening penetrates through the resin insulating layer and exposes a portion of the first conductor layer, and forming a second conductor layer on the surface of the resin insulating layer such that the second conductor layer is formed in contact with the surface of the resin insulating layer and that a via conductor is formed in the opening of the resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
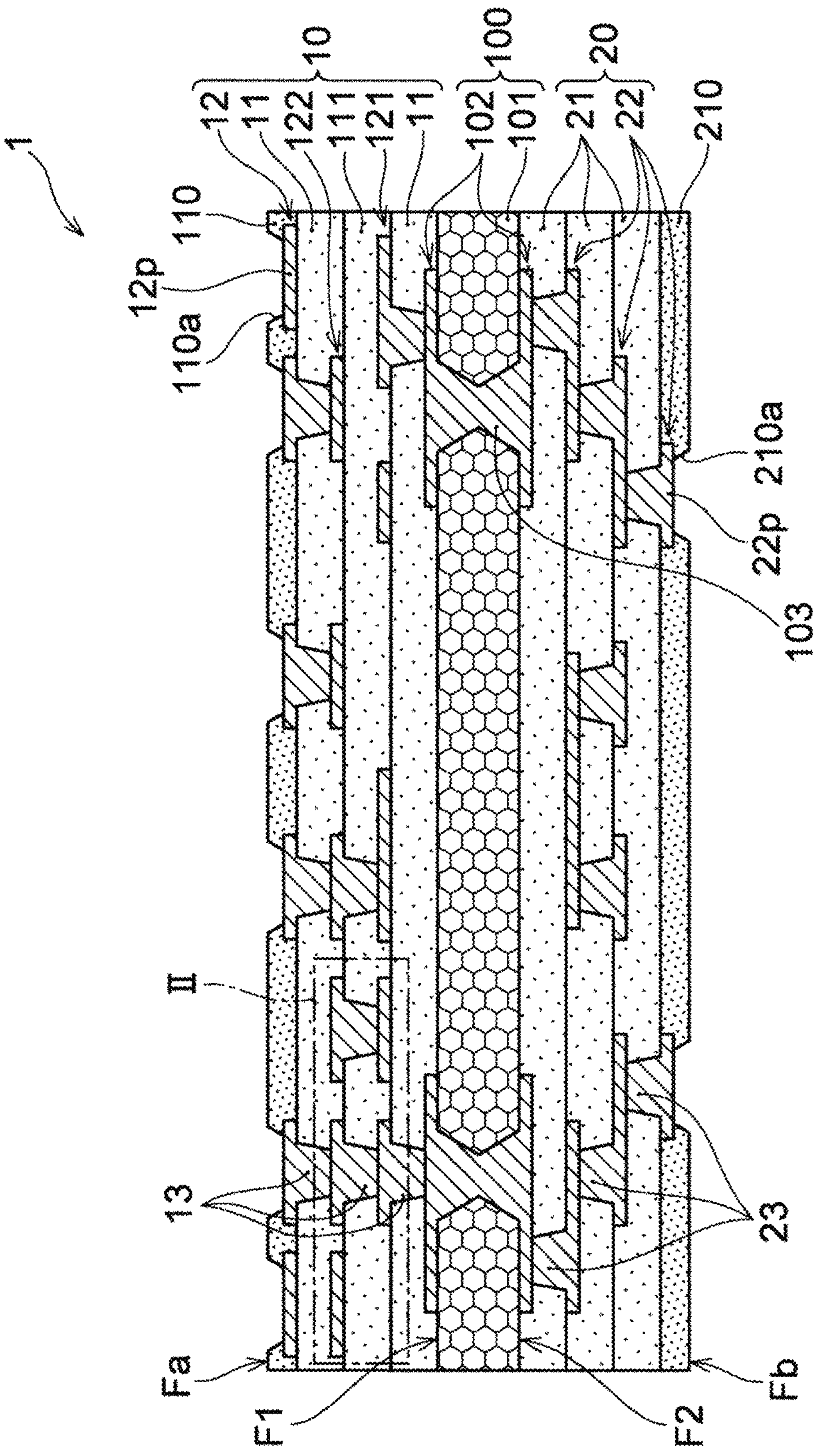
FIG. 1 is a cross-sectional view illustrating an example of a wiring substrate manufactured using a method according to an embodiment of the present invention.

Embodiments will now be described with reference to the accompanying drawings, wherein like reference numerals designate corresponding or identical elements throughout the various drawings.

A wiring substrate manufactured using a method for manufacturing a wiring substrate according to an embodiment of the present invention is described with reference to the drawings. The drawings to be referenced below are drawn such that features of the embodiment are easily understood, without intending to show exact proportions of structural elements. FIG. 1 illustrates a cross-sectional view of a wiring substrate 1 as an example of a wiring substrate manufactured using the manufacturing method of the embodiment.

The wiring substrate 1 in the example illustrated in FIG. 1 includes a core substrate 100 that includes an insulating layer (core insulating layer) 101 and conductor layers (core conductor layers) 102 respectively formed on both sides of the core insulating layer 101. On each of both sides of the core substrate 100, insulating layers and conductor layers are alternately laminated. In the illustrated example, a first build-up part 10 in which insulating layers (11, 111) and conductor layers (12, 121, 122) are laminated is formed on a surface (F1) on one side of the core substrate 100. Further, a second build-up part 20 in which insulating layers 21 and conductor layers 22 are laminated is formed on a surface (F2) on the other side of the core substrate 100.

A solder resist layer 110 is formed on the first build-up part 10. A solder resist layer 210 is formed on the second build-up part 20. Openings (110*a*) are formed in the solder resist layer 110, and conductor pads (12*p*) of the outermost conductor layer 12 in the first build-up part 10 are exposed in the openings (110*a*). Openings (210*a*) are formed in the solder resist layer 210, and conductor pads (22*p*) of the outermost conductor layer 22 in the second build-up part 20 are exposed in the openings (210*a*).

In the description of the method for manufacturing a wiring substrate of the embodiment and a wiring substrate to be manufactured, the conductor layer 121 of the first build-up part 10 in the wiring substrate 1 is also referred to as the first conductor layer 121. The insulating layer 111 that covers an upper side of the first conductor layer 121 is also referred to as the first resin insulating layer 111. The conductor layer 122 formed on an upper side of the first resin insulating layer 111 is also referred to as the second conductor layer 122.

In the description of the wiring substrate 1 and the method for manufacturing the wiring substrate 1, a side farther from the core insulating layer 101 is referred to as "upper," "upper side," "outer side," or "outer," and a side closer to the core insulating layer 101 is referred to as "lower," "lower side," "inner side," or "inner." Further, for the insulating layers and the conductor layers, a surface facing the opposite side with respect to the core substrate 100 is also referred to as an "upper surface," and a surface facing the core substrate 100 side is also referred to as a "lower surface." Therefore, in the description of the wiring substrate manufactured using the manufacturing method of the embodiment, a surface of the first conductor layer 121 facing the opposite side with respect to the core insulating layer 101 is also referred to as an upper surface of the first conductor layer 121.

A surface of the first resin insulating layer 111 facing the opposite side with respect to the core insulating layer 101, that is, a surface of the first resin insulating layer 111 on the opposite side with respect to the first conductor layer 121 is also referred to as an upper surface of the first resin insulating layer 111.

In the illustrated example, an outermost surface of the wiring substrate 1 formed of exposed surfaces of the conductor pads (12*p*) and the solder resist layer 110 is also referred to as a first surface (Fa). An outermost surface of the wiring substrate 1 that is on the opposite side with respect to the first surface (Fa) and is formed of exposed surfaces of the solder resist layer 210 and the conductor pads (22*p*) is also referred to as a second surface (Fb). That is, the wiring substrate 1 has the first surface (Fa) and the second surface (Fb) on the opposite side with respect to the first surface (Fa) as two surfaces that extend in a direction orthogonal to a thickness direction of the wiring substrate 1.

The conductor layers (102, 12, 121, 122, 22) of the wiring substrate 1 are patterned to have any conductor patterns. In the illustrated example, the outermost conductor layer 12 in the first build-up part 10 has conductor pads (12*p*) that are formed in patterns that are electrically and mechanically connected to connection terminals of a component that is mounted on the wiring substrate 1 when the wiring substrate 1 is used.

That is, the conductor pads (12*p*), which form the first surface (Fa), are used as connection parts when an external component is mounted on the wiring substrate 1, and the first surface (Fa) of the wiring substrate 1 is a component mounting surface on which multiple components are mounted. Electrodes of an external component are electrically and mechanically connected to the conductor posts (12*p*), for example, via a bonding material (not illustrated in the drawings) such as solder. As an external component, an electronic component such as a bare chip semiconductor is mounted on the component mounting surface.

The second surface (Fb), which is a surface on the opposite side with respect to the first surface (Fa), of the wiring substrate 1 in the example illustrated in FIG. 1, is a connection surface that is connected, for example, to an external element such as a motherboard of any electrical device when the wiring substrate 1 is mounted on the external element. Further, similar to the first surface (Fa), the second surface (Fb) may be a component mounting surface on which an electronic component such as a semiconductor integrated circuit device is mounted. Without being limited to these, the conductor pads (22*p*) forming the second surface (Fb) are connected to any substrate, electrical component, mechanism element, or the like.

In the insulating layer 101 of the core substrate 100, through-hole conductors 103 are formed connecting the conductor layer 102 that forms the surface (F1) on the one side of the core substrate 100 and the conductor layer 102 that forms the surface (F2) on the other side of the core substrate 100. In the insulating layers (11, 111, 21), via conductors (13, 23) connecting the conductor layers sandwiching the insulating layers (11, 111, 21) are formed. In the illustrated example, each of the through-hole conductors 103 has a tapered shape that is reduced in diameter from both the surface (F1) on the one side and the surface (F2) on the other side toward a center portion in a thickness direction of the core substrate 100, and each of the via conductors (13, 23) has a tapered shape that is reduced in diameter from an outer side toward an inner side of the wiring substrate. It is also possible that each of the through-hole conductors 103 is formed to have substantially the same diameter in a length direction (the thickness direction of the core substrate 100), or to have a tapered shape that is reduced in diameter from one side toward the other side (for example, from the surface (F1) on the one side toward the surface (F2) on the other side).

Each of the insulating layers (101, 11, 111, 21) is formed, for example, using an insulating resin such as an epoxy resin, a bismaleimide triazine resin (BT resin) or a phenol resin. Each of the insulating layers may contain a reinforcing material (core material) such as a glass fiber and/or inorganic filler such as silica or alumina. Each of the solder resist layers (110, 210) may be formed using, for example, a photosensitive epoxy resin or polyimide resin, or the like.

Each of the conductor layers (102, 12, 121, 122, 22), the via conductors (13, 23), and the through-hole conductors 103 is formed using any metal such as copper or nickel, and, for example, formed of a metal foil such as a copper foil and/or a metal film formed by plating or sputtering or the like. Each of the conductor layers (102, 12, 121, 122, 22), the via conductors (13, 23), and the through-hole conductors 103 is illustrated in FIG. 1 as having a single-layer structure, but may have a multilayer structure that includes two or more metal layers. For example, each of the conductor layers 102 that are respectively formed on the surfaces of the insulating layer 101 may have a three-layer structure including a metal foil (for example, a copper foil), a metal film (for example, an electroless plating film), and a plating film (for example, an electrolytic plating film). Further, each of the conductor layers (12, 121, 122, 22), the via conductors (13, 23), and the through-hole conductors 103 may have, for example, a two-layer structure including a metal film and an electrolytic plating film.

On the surfaces of the conductor layers (102, 12, 121, 122, 22), an organic coating film (covering layer) is formed that improves adhesion between the conductor layers (102, 12, 121, 122, 22) and the insulating layers (11, 111, 21) covering the conductor layers (102, 12, 121, 122, 22). Further, the upper surfaces of the insulating layers (11, 111, 21) are roughened in order to improve adhesion to the conductor layers (121, 122, 12, 22) formed thereon. The covering layer formed on the surfaces of the conductor layers and the upper surfaces of the insulating layers, which are roughened, are described in detail with reference to an enlarged view of FIG. 2A.

Figure 2A:
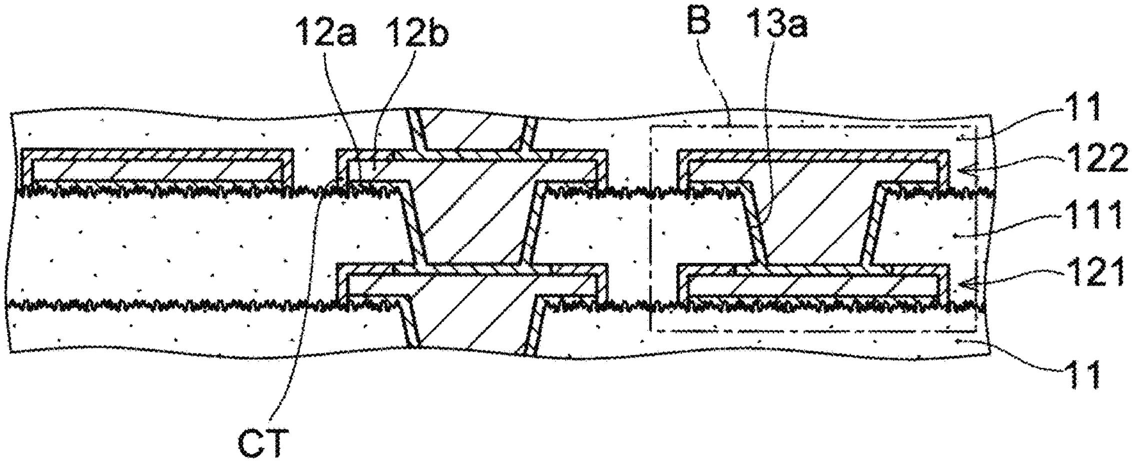
FIG. 2A is a partial enlarged view of the cross-sectional view illustrated in FIG. 1.

FIG. 2A illustrates an enlarged view of a region (II), which is surrounded by a one-dot chain line in FIG. 1 and includes the first conductor layer 121, the first resin insulating layer 111, and the second conductor layer 122. In the illustrated enlarged view, an example is illustrated in which each of the conductor layers (121, 122) includes two layers including a metal film layer (12*a*) and an electrolytic plating film (12*b*). In the illustrated example, surfaces (an upper surface and a side surface) of each of conductor patterns of the first conductor layer 121 are covered by the covering layer (CT), and the covering layer (CT) is also formed on a surface of the second conductor layer 122 formed in contact with the upper surface of the first resin insulating layer 111.

The covering layer(CT) is formed of, for example, a material that bonds to both an organic material such as a resin forming the resin insulating layers (11, 111) and an inorganic material such as a metal forming the conductor layers (121, 122). The covering layer (CT) improves adhesion of the conductor layers (121, 122) to the insulating layers (111, 11) formed thereon. An example of a material used for the covering layer (CT) is a silane coupling agent containing an azole silane compound such as a triazole compound.

For example, in a case where high-frequency signals are transmitted via the conductor layers (121, 122), when the adhesion to the resin insulating layers (111, 11) is improved by roughening the surfaces of the conductor layers (121, 122), transmission characteristics of high-frequency signals may be degraded due to influence of a skin effect.

By improving the adhesion of the conductor layers (121, 122) to the resin insulating layers (111, 11) by the covering layer (CT) without roughening the conductor layers (121, 122), it may be possible to improve the transmission characteristics of high frequency signals of the conductor layers (121, 122).

As illustrated, the upper surfaces of the resin insulating layers (11, 111) are roughened. Specifically, as will be described later regarding the method for manufacturing a wiring substrate, in particular, the upper surface of the first resin insulating layer 111 is roughened to a desirable degree from a point of view of the adhesion to the conductor layer 122. For example, the roughened upper surface of the first resin insulating layer 111 has a surface roughness of about 0.03 μm-1.0 μm in arithmetic mean roughness. The adhesion between the resin insulating layer 111 and the second conductor layer 122 is improved, and a risk that a defect such as peeling may occur is reduced. FIG. 2A illustrates an example in which the upper surface of the insulating layer 11 positioned below the first conductor layer 121 is also roughened.

Figure 2B:
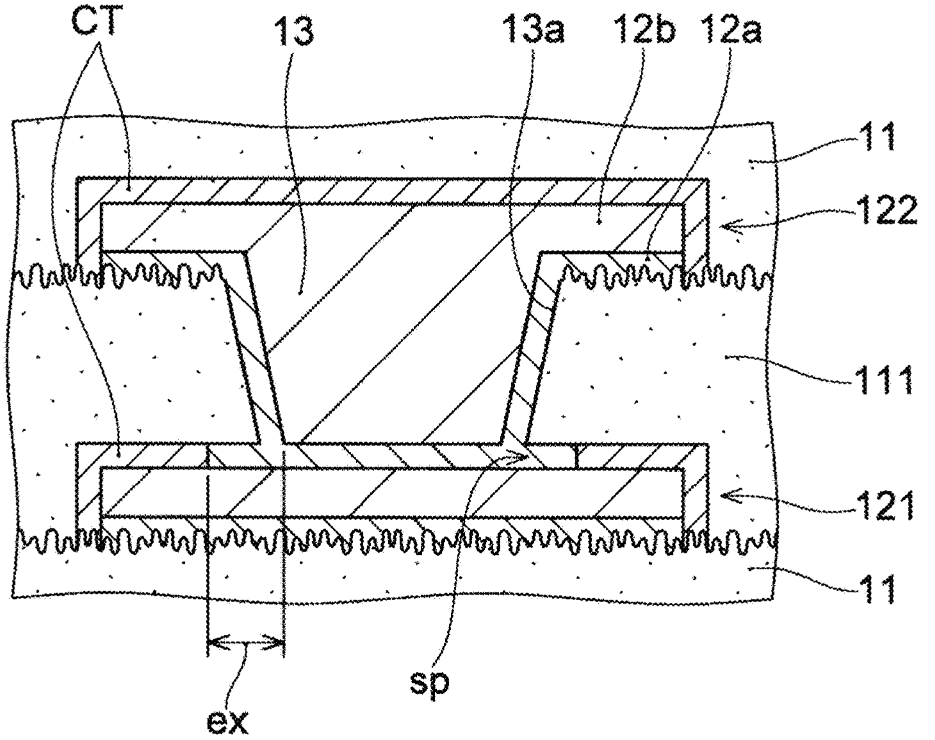
FIG. 2B is a partial enlarged view of the cross-sectional view illustrated in FIG. 2A.

Further, in particular, inner sides of openings (13*a*) formed in the first resin insulating layer 111 are in a desirable state from a point of view of suppressing occurrence of a short circuit in the first conductor layer 121. Specifically, as illustrated in FIG. 2B, which is an enlarged view of a region (B) in FIG. 2A, a gap (sp) extending from a peripheral edge of a bottom part of an opening (13*a*) formed in the first resin insulating layer 111 (from a corner between an inner wall of the opening (13*a*) and the first conductor layer 121) along the upper surface of the first conductor layer 121 may occur. A dimension (ex) (depth from the peripheral edge of the bottom part) of the gap (sp) between the first conductor layer 121 and the first resin insulating layer 111 is kept relatively small. Therefore, for a via conductor 13 filling the opening (13*a*) and the gap (sp), spreading of the via conductor 13 along the upper surface of the first conductor layer 121 at a bottom part of the via conductor 13 is kept relatively small.

When the gap (sp) extending from the peripheral edge of the bottom part of the opening (13*a*) has a relatively large dimension along the upper surface of the first conductor layer 121, the conductor filling the gap (sp) may be close to an adjacent pattern of the first conductor layer 121, and there may be an increased risk that a short circuit between conductor patterns may occur. From a point of view of suppressing such a short circuit, the dimension of the gap (sp) at the bottom part of the opening (13*a*) is preferably kept relatively small, and is preferably 1.0 μm or less.

Specifically, as will be described later regarding the method for manufacturing a wiring substrate, a desirable roughness of the upper surface of the first resin insulating layer 111 from a point of view of adhesion to the second conductor layer 122 and a desirable state of the openings (13*a*) (for example, a desirable state from a point of view of residue removal and short-circuit suppression) are achieved by roughening the upper surface of the first resin insulating layer 111 before forming the openings (13*a*).

Figure 3A:
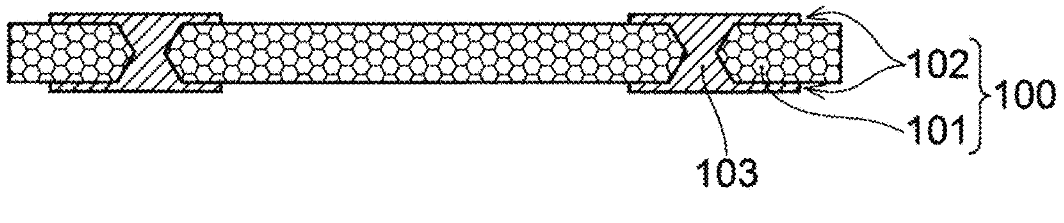
FIG. 3A illustrates an example of a method for manufacturing a wiring substrate according to an embodiment of the present invention.

With reference to FIGS. 3A-3K, a method for manufacturing a wiring substrate of the embodiment is described using a case where the wiring substrate 1 illustrated in FIG. 1 is manufactured as an example. First, as illustrated in FIG. 3A, the core substrate 100 is prepared. In the preparation of the core substrate 100, for example, a double-sided copper-clad laminated plate including the core insulating layer 101 is prepared. Then, the core substrate 100 is prepared by using a subtractive method or the like to form the conductor layers 102 including predetermined conductor patterns on both sides of the insulating layer 101 and form the through-hole conductors 103 in the insulating layer 101.

Figure 3B:
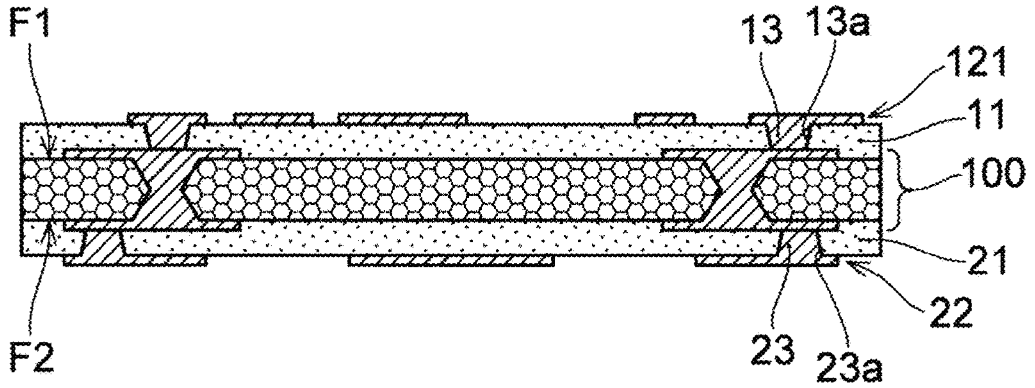
FIG. 3B illustrates an example of a method for manufacturing a wiring substrate according to an embodiment of the present invention.

Next, as illustrated in FIG. 3B, the insulating layer 11 is formed on the surface (F1) on the one side of the core substrate 100, and the conductor layer 121 is laminated on the insulating layer 11. The insulating layer 21 is formed on the surface (F2) on the other side of the core substrate 100, and the conductor layer 22 is laminated on the insulating layer 21. For example, each of the insulating layers (11, 21) is formed by thermocompression bonding a film-like insulating resin onto the core substrate 100. The conductor layers (121, 22) are formed using any method for forming conductor patterns, such as a semi-additive method, at the same time as the via conductors (13, 23) filling the openings (13a, 23*a*) that are formed in the insulating layers (11, 21), for example, using laser. The upper surfaces of the insulating layers (11, 21) are roughened to improve adhesion between the insulating layers (11, 21) and the conductor layers (121, 22). The covering layer (CT) is formed on the surfaces of the conductor layers (121, 22) to improve adhesion between the conductor layers (121, 22) and the insulating layers formed on the conductor layers (121, 22).

Figure 3C:
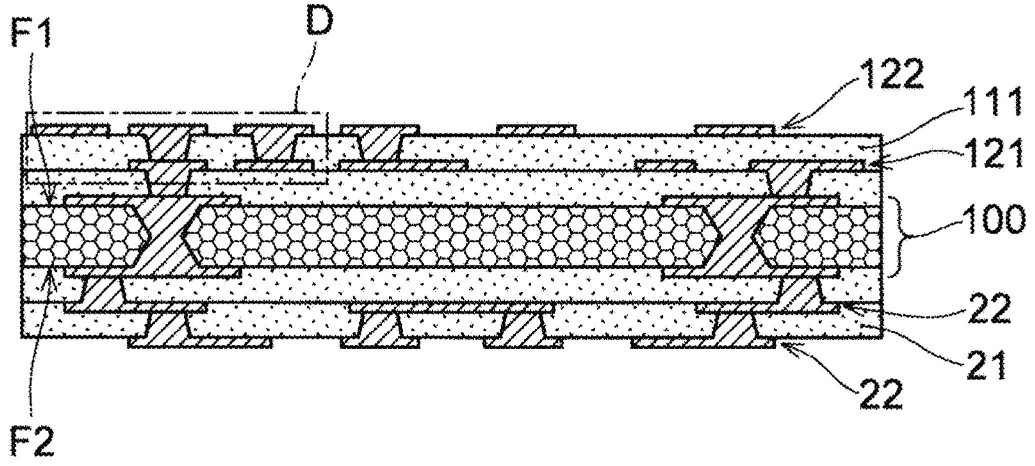
FIG. 3C illustrates an example of a method for manufacturing a wiring substrate according to an embodiment of the present invention.

Subsequently, as illustrated in FIG. 3C, on an outer side of the surface (F1) on the one side and the surface (F2) on the other side of the core substrate 100, lamination of an insulating layer and a conductor layer is further repeated. On the surface (F1) side on the one side of the core substrate 100, the first resin insulating layer 111 is laminated on the first conductor layer 121, and the second conductor layer 122 is further formed on the first resin insulating layer 111. On the surface (F2) side on the other side of the core substrate 100, the insulating layer 21 is formed on the conductor layer 22, and the conductor layer 22 is further formed on the insulating layer 21.

The formation of the first resin insulating layer 111 on the first conductor layer 121 and the formation of the second conductor layer 122 on the first resin insulating layer 111 illustrated in FIG. 3C are further described in detail with reference to FIGS. 3D-3J. Each of FIGS. 3D-3J illustrates an enlarged view of a portion corresponding a region (D) that includes the first conductor layer 121, the first resin insulating layer 111, and the second conductor layer 122 illustrated in FIG. 3C.

Figure 3D:
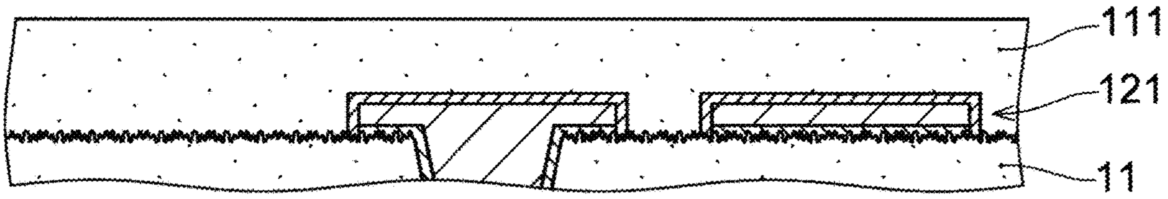
FIG. 3D is a partial enlarged view illustrating an example of a method for manufacturing a wiring substrate according to an embodiment of the present invention.

Subsequent to the state illustrated in FIG. 3B, first, as illustrated in FIG. 3D, for example, the first resin insulating layer 111 is formed by thermocompression bonding a film-like insulating resin on the first conductor layer 121 and the insulating layer 11 exposed from the conductor patterns of the first conductor layer 121.

Figure 3E:
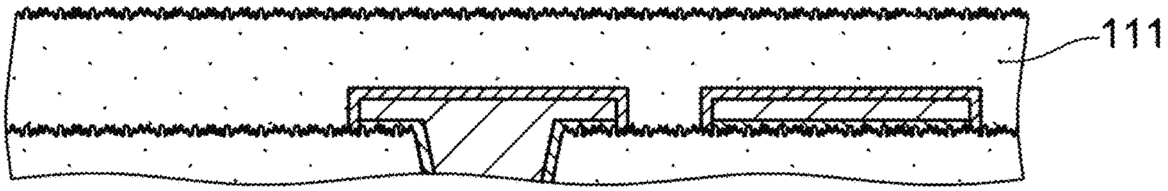
FIG. 3E is a partial enlarged view illustrating an example of a method for manufacturing a wiring substrate according to an embodiment of the present invention.

Next, as illustrated in FIG. 3E, the upper surface of first resin insulation layer 111 is roughened to form a rough surface. For example, the upper surface of the first resin insulating layer 111 is roughened by wet processing using a chemical containing an oxidizing agent such as permanganate. A degree of the roughening of the upper surface of the first resin insulating layer 111 may be adjusted by adjusting a concentration of a chemical to be used, a processing time, a processing temperature, and the like. From a point of view of achieving good adhesion between the first resin insulating layer 111 and the conductor layer formed in contact with the first resin insulating layer 111, the upper surface of the first resin insulating layer 111 preferably has an arithmetic mean roughness (Ra) of about 0.03 μm-1.0 μm.

Figure 3F:
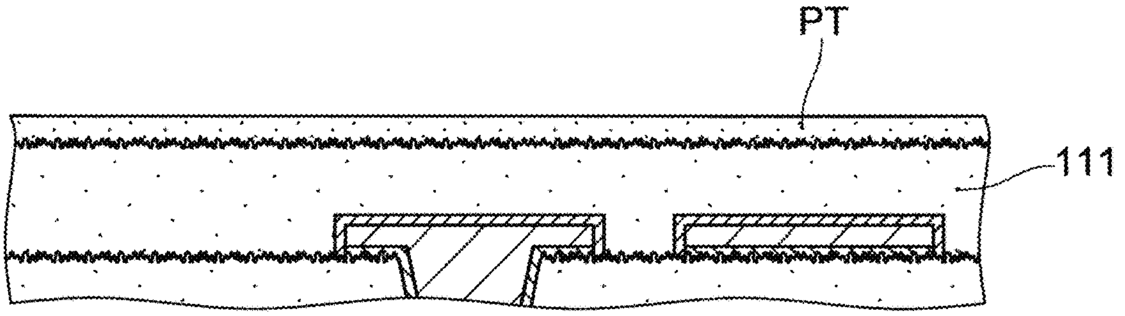
FIG. 3F is a partial enlarged view illustrating an example of a method for manufacturing a wiring substrate according to an embodiment of the present invention.

Next, as illustrated in FIG. 3F, a protective layer (PT) is formed on the upper surface of the first resin insulating layer 111. The protective layer (PT) is provided in order to avoid undesirable influence such as variation in roughness of the rough surface formed on the upper surface of the first resin insulating layer 111 in subsequent processes of forming via holes in the first resin insulating layer 111 and performing a desmear treatment in the via holes. The protective layer (PT) may be provided, for example, by attaching a resin film such as a polyethylene terephthalate (PET) film on the upper surface of the first resin insulating layer 111.

Figure 3G:
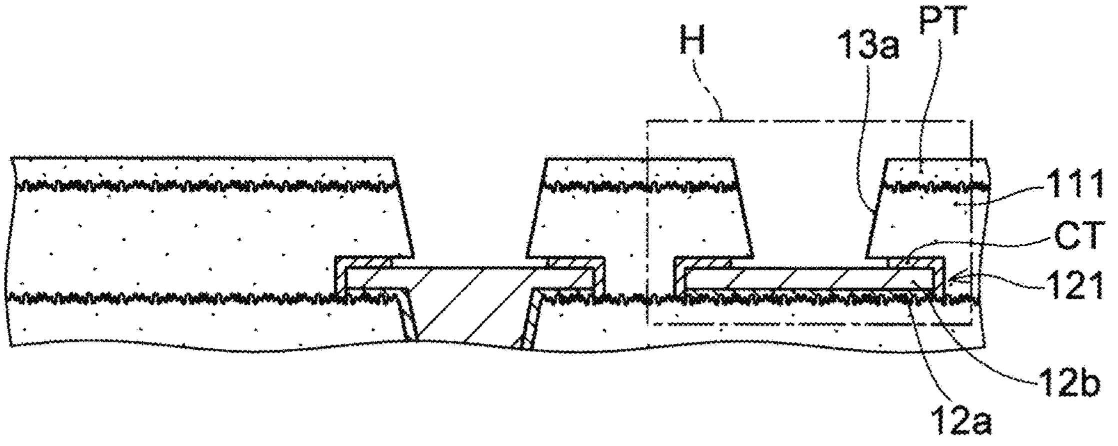
FIG. 3G is a partial enlarged view illustrating an example of a method for manufacturing a wiring substrate according to an embodiment of the present invention.

Next, as illustrated in FIG. 3G, the openings (13*a*) are formed in the first resin insulating layer 111. The openings (13*a*) may be formed by irradiating laser from an upper side of the protective layer (PT) to positions where the openings (13*a*) are to be formed in the first resin insulating layer 111. As the laser, for example, excimer laser is preferably used, which has relatively excellent straightness and allows an amount of resin residues generated in the openings (13*a*) to be formed to be kept relatively small. The openings (13*a*) may be formed by irradiation with $CO_2$ laser or YAG laser or the like. By irradiation with laser, the covering layer (CT) formed on the surface of the first conductor layer 121 is also partially removed, and the conductor (electrolytic plating film (12*b*)) forming the first conductor layer 121 is exposed at bottom parts of the openings (13*a*).

After the formation of the openings (13*a*) using laser, in the state in which the protective layer (PT) is formed on the upper surface of the first resin insulating layer 111, a desmear treatment may be performed in which resin residues that remain in the openings (13*a*) are removed. As the desmear treatment in the openings (13*a*), preferably, a dry treatment may be carried out, for example, a plasma treatment using CF4 or CF4+O2, or a treatment using corona discharge may be performed.

When the desmear treatment is being performed, the upper surface of the first resin insulating layer 111 is covered by the protective layer (PT). Therefore, influence due to the desmear treatment on the upper surface of the first resin insulating layer 111 is prevented, and the roughness illustrated in FIG. 3E is maintained on the upper surface of the first resin insulating layer 111. Therefore, conditions such as a processing time of the desmear treatment in the openings (13*a*) performed, for example, in a dry manner, are determined without worrying about influence on the upper surface of the first resin insulating layer 111. Therefore, the desmear treatment may be performed under conditions that allow resin residues to be satisfactorily removed from the openings (13*a*).

Figure 3H:
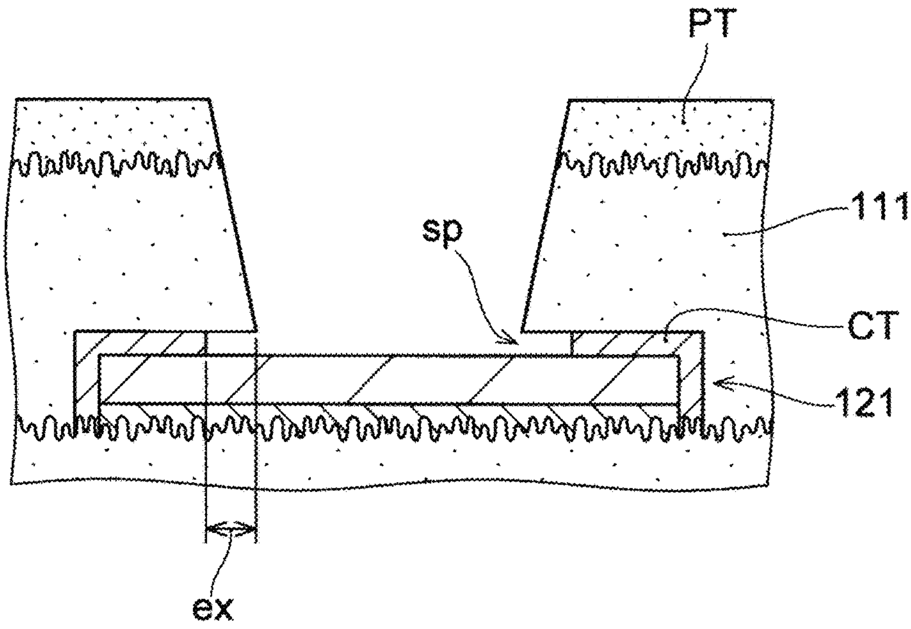
FIG. 3H is a partial enlarged view illustrating an example of a method for manufacturing a wiring substrate according to an embodiment of the present invention.

As illustrated in FIG. 3H, which is an enlarged view of a region (H) in FIG. 3G, due to the desmear treatment on an inner surface of each opening (13*a*), a gap (sp) between the upper surface of the first conductor layer 121 and the first resin insulating layer 111 may occur at a peripheral edge of a bottom part of the opening (13*a*). The gap (sp) may have, as a dimension thereof, a length (ex) from the peripheral edge of the bottom part of the opening (13*a*) to a front end of the gap (sp) in a direction away from the opening (13*a*).

Following the formation of the openings (13*a*) using laser and the desmear treatment on the inner surfaces of the openings (13*a*), the inner surfaces of the openings (13*a*) may be subjected to ultrasonic cleaning. In the formation of the openings (13*a*), for example, laser ablation of a resin material forming the first resin insulating layer 111 may cause filler particles that are contained in the resin to fall off and remain in the openings. Such residues such as filler particles that remain in the openings (13*a*) may be removed by ultrasonic cleaning.

In the formation of the openings (13*a*), when excimer laser or the like that relatively suppresses residues remaining in the openings (13*a*) is used, it may be also possible that, after the formation of the openings (13*a*), ultrasonic cleaning is performed without performing a desmear treatment. It is also possible that the above-described formation of the openings (13*a*) in the first resin insulating layer 111, desmear treatment on the inner surfaces of the openings (13*a*), and ultrasonic cleaning are performed in a state in which the above-described protective layer (PT) is not provided on the upper surface of the first resin insulating layer 111, and the upper surface of the first resin insulating layer 111 is exposed. In particular, when the desmear treatment is performed in a dry manner, influence of the desmear treatment on the upper surface of the first resin insulating layer 111 is relatively small, and even when the protective layer (PT) is not provided, it may be possible that the upper surface of the first resin insulating layer 111 is maintained as a rough surface in a desirable state.

Figure 3I:
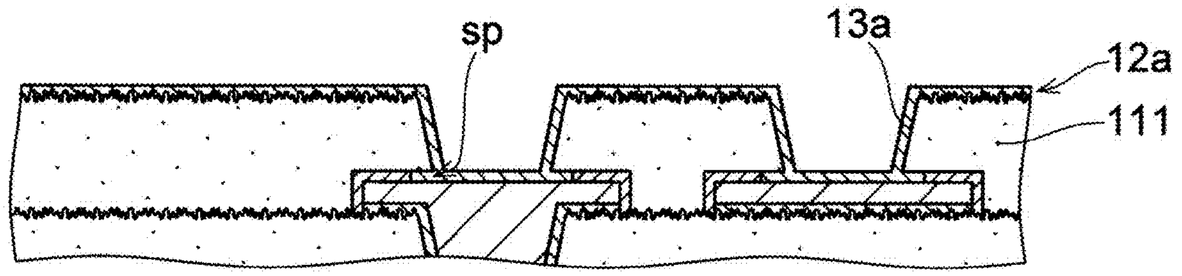
FIG. 3I is a partial enlarged view illustrating an example of a method for manufacturing a wiring substrate according to an embodiment of the present invention.

After the ultrasonic cleaning treatment on the inner surfaces of the openings (13*a*) is completed, as illustrated in FIG. 3I, the protective layer (PT) is removed from the first resin insulating layer 111, and the metal film (12*a*) is formed over the entire upper surface of the first resin insulating layer 111 and inner surfaces of the openings (13*a*). The metal film (12*a*) is formed by electroless plating or sputtering in an entire region including the roughened upper surface of the first resin insulating layer 111, which is exposed by the removal of the protective layer (PT), and inner wall surfaces and bottom surfaces of the openings (13*a*). Since the upper surface of the first resin insulating layer 111 is roughened, a metal film (12*a*) having good adhesion to the upper surface of the first resin insulating layer 111 is formed.

The metal film (12*a*) also fills the gap (sp) that occurs at the peripheral edge of the bottom part of each of the openings (13*a*). When the dimension (ex) (see FIG. 3H) of the gap (sp) is relatively large, it may be possible that the metal film (12*a*) filling the gap (sp) is close to an adjacent wiring of the first conductor layer 121, and a risk of a short circuit increases. Therefore, the dimension (ex) of the gap (sp) in a planar direction is preferably relatively small. The dimension (ex) is preferably 1.0 μm or less, and such a preferable state of the peripheral edge of the bottom part of each of the openings (13*a*) may be realized by performing the above-described, for example, dry desmear treatment under appropriate conditions.

Figure 3J:
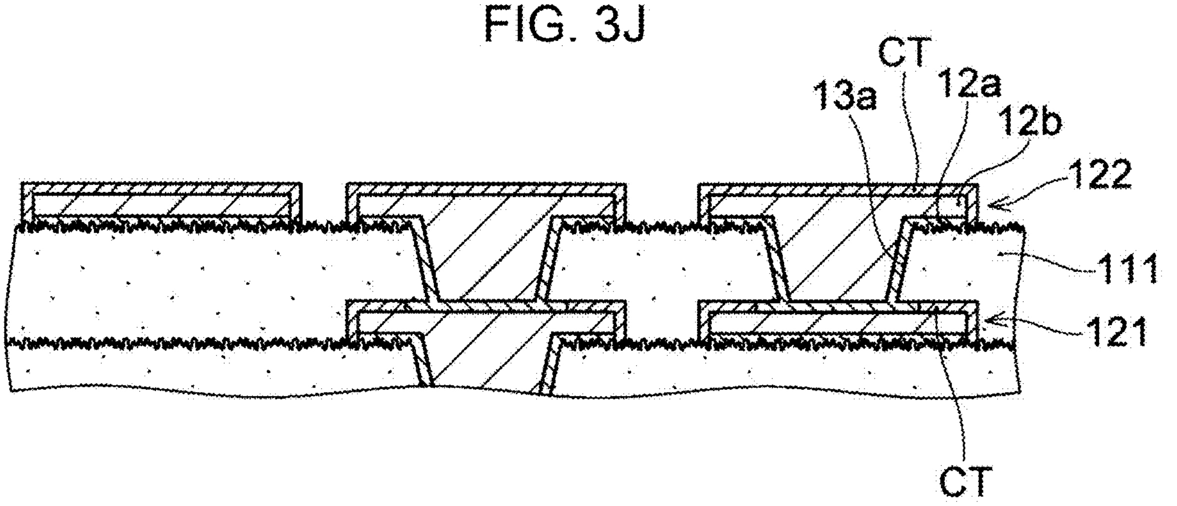
FIG. 3J is a partial enlarged view illustrating an example of a method for manufacturing a wiring substrate according to an embodiment of the present invention.

Next, as illustrated in FIG. 3J, the second conductor layer 122 is formed. A plating resist (not illustrated in the drawings) having openings corresponding to the conductor patterns of the second conductor layer 122 to be formed is formed on the metal film (12*a*), and the electrolytic plating film (12*b*) is formed in the openings by electrolytic plating using the metal film (12*a*) as a seed layer. By the electrolytic plating, the openings (13*a*) are also filled with the electrolytic plating film (12*b*), and the via conductors 13 are formed. In the formation of the metal film (12*a*) described above, when there is an unfilled part in the gap (sp) at the peripheral edge of the bottom part of each of the openings (13*a*), the unfilled part is filled with the electrolytic plating film (12*b*). After that, the plating resist is removed, and thereby, the exposed metal film (12*a*) is removed. As illustrated, the via conductors 13 and the second conductor layer 122 are integrally formed.

Next, the covering layer (CT) is formed on the upper and side surfaces of the second conductor layer 122. For example, by exposure and development of a photosensitive material, a resist film (not illustrated in the drawings) is formed covering a region excluding a region where the covering layer (CT) is to be formed, and the covering layer (CT) is formed covering a portion that is not covered by the resist film. The covering layer (CT) is formed, for example, by immersion in or spraying a liquid containing a material that bonds to both an organic material and an inorganic material, such as a silane coupling agent. Next, the resist film is removed, and the formation of the second conductor layer 122 of which the surface is covered by the covering layer (CT) is completed. Also in the formation of the first conductor layer 121 described above, a covering layer (CT) may be formed in a similar process. In the above, an example is described in which the covering layer (CT) is formed on the first conductor layer 121 and the second conductor layer 122. However, it is also possible that the method for manufacturing a wiring substrate of the present embodiment does not include the formation of the covering layer (CT). It is also possible that the covering layer (CT) is not formed on the surfaces of the first and second conductor layers (121, 122), and the electrolytic plating film (12*b*) of each of the first and second conductor layers (121, 122) is in contact with the insulating layer on the electrolytic plating film (12*b*).

In the method for manufacturing a wiring substrate of the present embodiment, the upper surface of the first resin insulating layer 111 is formed to be a rough surface having a good degree of surface roughness from a point of view of the adhesion to the second conductor layer 122, and formed such that the second conductor layer 122 and the first resin insulating layer 111 have relatively high adhesion to each other. On the other hand, the inner surfaces of the openings (13*a*) formed in the first resin insulating layer 111 may be subjected to a desmear treatment under desirable conditions from a point of view of residue removal. Further, the dimension (ex) (see FIG. 3H) of the gap (sp) occurring at the peripheral edge of the bottom part of each of the openings (13*a*) formed in the first resin insulating layer 111 is kept relatively small, and a risk that a short circuit may occur in the first conductor layer 121 is reduced.

In other words, according to the method for manufacturing a wiring substrate of the present embodiment, by subjecting the upper surface of the first resin insulating layer 111 to a roughening treatment before the formation of the openings (13*a*), good adhesion between the first resin insulating layer 111 and the second conductor layer 122 is realized, and at the same time, the inner surfaces of the openings (13*a*) are in a good state from a point of view of residue removal. In addition, suppression of a short circuit in the first conductor layer 121 is also be realized. When the roughening of the upper surface of the first resin insulating layer 111 and the desmear treatment on the inner surfaces of the openings (13*a*) are performed at the same time after the formation of the openings (13*a*), it may be difficult to achieve a desirable degree of the roughening of the upper surface and a desirable degree of the desmear treatment on the inner surfaces of the openings (13*a*), and a relatively large gap (sp) may occur. Comparing to this, in the present embodiment, the roughening on the first resin insulating layer 111 may be performed under desirable conditions from a point of view of adhesion without adversely affecting the inner surfaces of the openings (13*a*). On the other hand, the treatment on the inner surfaces of the openings (13*a*), when necessary, may be performed under desirable conditions from a point of view of residue removal and short circuit suppression.

Figure 3K:
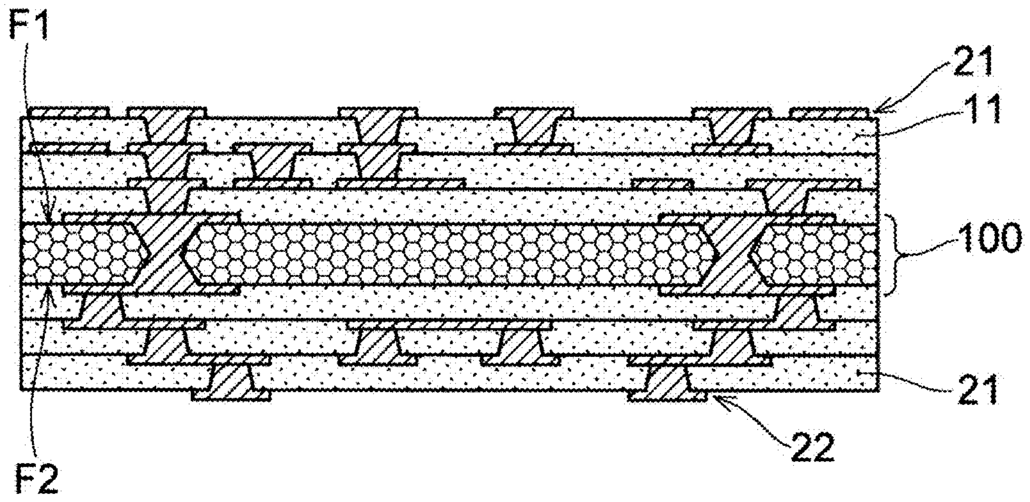
FIG. 3K illustrates an example of a method for manufacturing a wiring substrate according to an embodiment of the present invention.

Subsequently, as illustrated in FIG. 3K, on both sides of the core substrate 100, lamination of the insulating layers (11, 21) and the conductor layers (12, 22) is further performed. The insulating layers (11, 21) and the conductor layers (12, 22) may be formed using the same method as that for the formation of the first resin insulating layer 111 and the second conductor layer 122 described above.

Figure 3L:
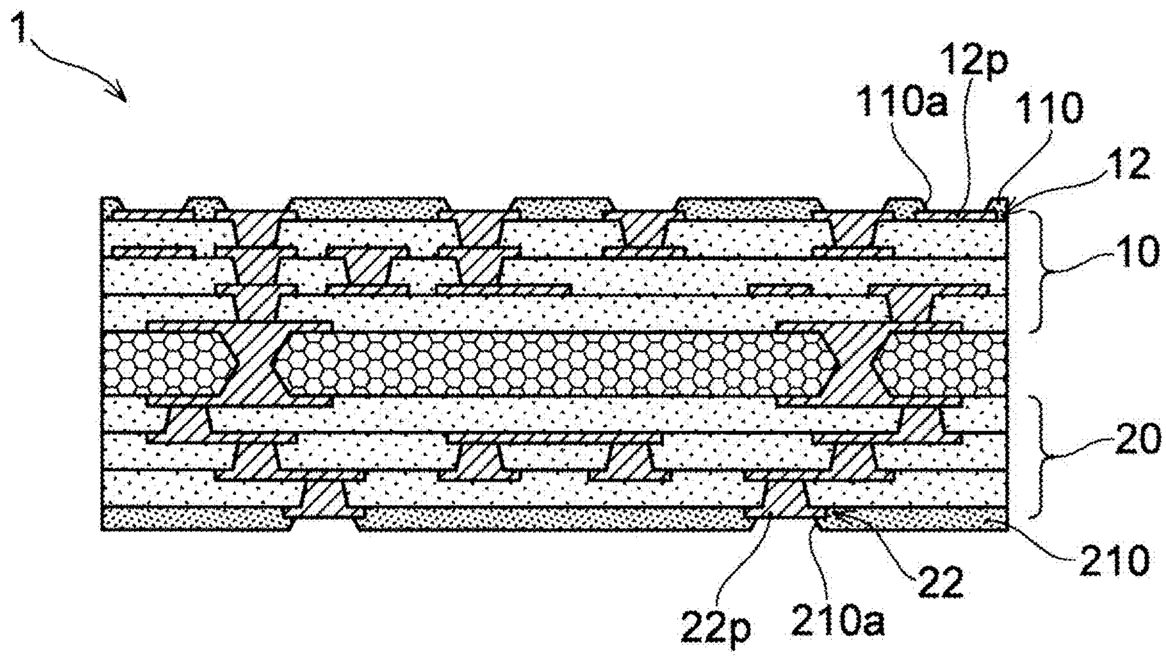
FIG. 3L illustrates an example of a method for manufacturing a wiring substrate according to an embodiment of the present invention.

Next, as illustrated in FIG. 3L, the solder resist layer 110 covering the upper surface of the outermost conductor layer 12 of the first build-up part 10 is formed. At the same time, the solder resist layer 210 covering the upper surface of the outermost conductor layer 22 of the second build-up part 20 is formed. For example, a photosensitive epoxy resin film is formed on the conductor layers (12, 22) by spray coating, curtain coating, or film pasting. The openings (110*a*, 210*a*) are formed in the solder resist layers (110, 210) by exposure and development. The conductor pads (12*p*) are exposed from the openings (110*a*) of the solder resist layer 110, and the conductor pads (22*p*) are exposed from the openings (210*a*) of the solder resist layer 210. On the conductor pads (12*p*, 22*p*), a surface protective film (not illustrated in the drawings) formed of Au, Ni/Au, Ni/Pd/Au, solder, heat-resistant preflux, or the like may be formed by electroless plating, solder leveling, spray coating, or the like. Through the above processes, the wiring substrate 1 illustrated in FIG. 1 is completed.

A method for manufacturing a wiring substrate according to an embodiment of the present invention is not limited the method described with reference to the drawings. In the manufacturing method of the present embodiment, at least, the first conductor layer 121, the first resin insulating layer 111, and the second conductor layer 122 are formed, and in the formation process thereof, it is sufficient when the roughening treatment on the upper surface of the first resin insulating layer 111 is performed before the formation of the openings (13*a*) in the first resin insulating layer 111. Therefore, a wiring substrate manufactured using the manufacturing method of the embodiment is not limited to the mode in which the first and second build-up parts (10, 20) are formed on both sides of the core substrate 100. It is also possible that the formation of the core substrate 100 and the formation of the second build-up part 20 are omitted. For example, in the method for forming the first and second conductor layers (121, 122) and the other conductor layers (102, 12, 22) of the wiring substrate 1, the formation of the covering layer (CT) may be omitted. Further, the region where the covering layer (CT) is formed is not limited to the upper and side surfaces of the conductor patterns. The covering layer may also be formed on an upper surface of an insulating layer.

In the method for manufacturing a wiring substrate of the embodiment, the conditions, order, and the like of the manufacturing method described above may be changed as appropriate, except for the order of the roughening treatment with respect to the first resin insulating layer 111 and the formation of the openings (13*a*). Depending on a structure of an actually manufactured wiring substrate, some of the processes may be omitted, or other processes may be added.

Japanese Patent Application Laid-Open Publication No. 2001-85837 describes a method for manufacturing a multilayer printed wiring board. After an opening for a via hole is formed in an interlayer resin insulating layer formed on a conductor circuit, an inner wall of the opening and a surface of the interlayer resin insulating layer are treated with an oxidizing agent to form roughened surfaces.

In the method for manufacturing a printed wiring board described in Japanese Patent Application Laid-Open Publication No. 2001-85837, the roughening of the surface of the interlayer insulating layer and the roughening of the inner wall of the opening are performed at the same time using an oxidizing agent. It is thought that it is difficult to achieve both a desirable state (for example, a degree of roughening) on the surface of the interlayer insulating layer and a desirable state in the opening.

A method for manufacturing a wiring substrate according to an embodiment of the present invention includes: forming a first conductor layer and a first resin insulating layer that covers the first conductor layer; forming an opening that penetrates the first resin insulating layer and exposes the first conductor layer; and forming a via conductor in the opening and forming a second conductor layer in contact with an upper surface of the first resin insulating layer. The upper surface of the first resin insulating layer is subjected to a roughening treatment before the forming of the opening.

According to an embodiment of the present invention, a desirable rough surface is formed on the upper surface of the first resin insulating layer, and a desirable state in the opening is achieved. A highly reliable wiring substrate is provided in which good adhesion between a resin insulating layer and a conductor layer is realized, and at the same time, a via conductor formed in a good state in an opening is realized.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a wiring substrate, comprising:

forming a resin insulating layer on a first conductor layer such that the resin insulating layer covers the first conductor layer;

applying a roughening treatment on a surface of the resin insulating layer on an opposite side with respect to the first conductor layer;

covering the surface of the resin insulating layer with a protective layer after the roughening treatment on the surface of the resin insulating layer;

forming an opening in the resin insulating layer after the roughening treatment on the surface of the resin insulating layer such that the opening penetrates through the resin insulating layer and exposes a portion of the first conductor layer;

applying a dry desmear treatment comprising a plasma treatment on an inner surface of the resin insulating layer in the opening such that the dry desmear treatment is applied in a state in which the surface of the resin insulating layer is covered by the protective layer; and forming a second conductor layer on the surface of the resin insulating layer such that the second conductor layer is formed in contact with the surface of the resin insulating layer and that a via conductor is formed in the opening of the resin insulating layer, wherein the applying of the roughening treatment comprises wet processing using a chemical on the surface of the resin insulating layer, and the applying of the dry desmear treatment comprises applying the dry desmear treatment on the inner surface of the resin insulating layer in the opening before the forming of the second conductor layer.

2. The method for manufacturing a wiring substrate according to claim 1, the plasma treatment of the dry desmear treatment uses CF4, CF4+O2, or corona discharge.

3. The method for manufacturing a wiring substrate according to claim 2, wherein the chemical in the wet processing includes an oxidizing agent.

4. The method for manufacturing a wiring substrate according to claim 1, wherein the protective layer comprises a resin film.

5. The method for manufacturing a wiring substrate according to claim 1, wherein the forming of the opening includes irradiating excimer laser upon the resin insulating layer such that excimer laser irradiation forms the openings through the resin insulating layer.

6. The method for manufacturing a wiring substrate according to claim 1, further comprising:

applying ultrasonic cleaning on the inner surface of the resin insulating layer in the opening before the forming of the second conductor layer.

7. The method for manufacturing a wiring substrate according to claim 1, further comprising:

forming a covering layer comprising an organic coating film on a surface of the first conductor layer, wherein the resin insulating layer is formed on the covering layer such that the covering layer is embedded in the resin insulating layer and between the first conductor layer and the resin insulating layer, and the opening is formed in the resin insulating layer such that the opening penetrates through the resin insulating layer and the covering layer and exposes the portion of the first conductor layer.

8. The method for manufacturing a wiring substrate according to claim 1, wherein the applying of the roughening treatment comprises applying the roughening treatment on the surface of the resin insulating layer such that the surface of the resin insulating layer is formed to have an arithmetic mean roughness in a range of 0.03 μm to 1.0 μm.

9. The method for manufacturing a wiring substrate according to claim 2, wherein the chemical in the wet processing includes an oxidizing agent comprising permanganate.

10. The method for manufacturing a wiring substrate according to claim 1, wherein the covering the surface of the resin insulating layer with the protective layer comprises attaching the protecting layer comprising a resin film to the surface of the resin insulating layer.

11. The method for manufacturing a wiring substrate according to claim 2, wherein the forming of the opening includes irradiating excimer laser upon the resin insulating layer such that excimer laser irradiation forms the openings through the resin insulating layer.

12. The method for manufacturing a wiring substrate according to claim 2, further comprising:

applying ultrasonic cleaning on the inner surface of the resin insulating layer in the opening before the forming of the second conductor layer.

13. The method for manufacturing a wiring substrate according to claim 2, further comprising:

forming a covering layer comprising an organic coating film on a surface of the first conductor layer, wherein the resin insulating layer is formed on the covering layer such that the covering layer is embedded in the resin insulating layer and between the first conductor layer and the resin insulating layer, and the opening is formed in the resin insulating layer such that the opening penetrates through the resin insulating layer and the covering layer and exposes the portion of the first conductor layer.

14. The method for manufacturing a wiring substrate according to claim 2, wherein the applying of the roughening treatment comprises applying the roughening treatment on the surface of the resin insulating layer such that the surface of the resin insulating layer is formed to have an arithmetic mean roughness in a range of 0.03 μm to 1.0 μm.

15. The method for manufacturing a wiring substrate according to claim 3, wherein the forming of the opening includes irradiating excimer laser upon the resin insulating layer such that excimer laser irradiation forms the openings through the resin insulating layer.

16. The method for manufacturing a wiring substrate according to claim 3, further comprising:

applying ultrasonic cleaning on the inner surface of the resin insulating layer in the opening before the forming of the second conductor layer.

17. The method for manufacturing a wiring substrate according to claim 3, further comprising:

forming a covering layer comprising an organic coating film on a surface of the first conductor layer, wherein the resin insulating layer is formed on the covering layer such that the covering layer is embedded in the resin insulating layer and between the first conductor layer and the resin insulating layer, and the opening is formed in the resin insulating layer such that the opening penetrates through the resin insulating layer and the covering layer and exposes the portion of the first conductor layer.

18. The method for manufacturing a wiring substrate according to claim 3, wherein the applying of the roughening treatment comprises applying the roughening treatment on the surface of the resin insulating layer such that the surface of the resin insulating layer is formed to have an arithmetic mean roughness in a range of 0.03 μm to 1.0 μm.

19. The method for manufacturing a wiring substrate according to claim 4, wherein the forming of the opening includes irradiating excimer laser upon the resin insulating layer such that excimer laser irradiation forms the openings through the resin insulating layer.

20. The method for manufacturing a wiring substrate according to claim 4, further comprising:

applying ultrasonic cleaning on the inner surface of the resin insulating layer in the opening before the forming of the second conductor layer.

* * * * *